US012589452B2

(12) United States Patent
Yasui et al.

(10) Patent No.: US 12,589,452 B2
(45) Date of Patent: Mar. 31, 2026

(54) NON-ELECTROCONDUCTIVE FLUX, CONNECTED STRUCTURE, AND METHOD FOR PRODUCING CONNECTED STRUCTURE

(71) Applicant: SEKISUI CHEMICAL CO., LTD., Osaka (JP)

(72) Inventors: Hidefumi Yasui, Osaka (JP); Kiyoto Matsushita, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 212 days.

(21) Appl. No.: 18/271,531

(22) PCT Filed: Jan. 20, 2022

(86) PCT No.: PCT/JP2022/001988
§ 371 (c)(1),
(2) Date: Jul. 10, 2023

(87) PCT Pub. No.: WO2022/158527
PCT Pub. Date: Jul. 28, 2022

(65) Prior Publication Data
US 2024/0131633 A1 Apr. 25, 2024
US 2024/0227089 A9 Jul. 11, 2024

(30) Foreign Application Priority Data

Jan. 20, 2021 (JP) ................................. 2021-007135

(51) Int. Cl.
*B23K 35/36* (2006.01)
*B23K 35/02* (2006.01)
(Continued)

(52) U.S. Cl.
CPC ........ *B23K 35/3613* (2013.01); *B23K 35/025* (2013.01); *C08G 59/245* (2013.01);
(Continued)

(58) Field of Classification Search
CPC .. B23K 35/36; B23K 35/3613; B23K 35/025; C08G 59/245; C08G 59/4238; C08G 59/688
(Continued)

(56) References Cited

U.S. PATENT DOCUMENTS

| | | | | |
|---|---|---|---|---|
| 4,048,374 A | * | 9/1977 | Kotzsch | .............. C23F 11/1676 |
| | | | | 427/388.5 |
| 2005/0012208 A1 | | 1/2005 | Jang et al. | |
| 2011/0068483 A1 | | 3/2011 | Katsurayama | |

FOREIGN PATENT DOCUMENTS

| | | |
|---|---|---|
| JP | 2003-183480 | 7/2003 |
| JP | 2005-39206 | 2/2005 |
| | (Continued) | |

OTHER PUBLICATIONS

International Search Report (ISR) issued Apr. 19, 2022 in International (PCT) Application No. PCT/JP2022/001988.
(Continued)

*Primary Examiner* — Tremesha W Burns
(74) *Attorney, Agent, or Firm* — Wenderoth, Lind & Ponack, L.L.P.

(57) ABSTRACT

Provided is a non-electroconductive flux capable of enhancing productivity and impact resistance of a connected structure to be obtained and suppressing occurrence of solder flash. The non-electroconductive flux according to the present invention contains an epoxy compound, an acid anhydride curing agent, and an organophosphorus compound.

15 Claims, 2 Drawing Sheets

(51) Int. Cl.

| | |
|---|---|
| *C08G 59/24* | (2006.01) |
| *C08G 59/42* | (2006.01) |
| *C08G 59/68* | (2006.01) |
| *H01L 23/00* | (2006.01) |
| *H05K 3/341* | (2026.01) |
| *H05K 3/3489* | (2026.01) |
| *H05K 3/36* | (2006.01) |

(52) U.S. Cl.
CPC ....... *C08G 59/4238* (2013.01); *C08G 59/688* (2013.01); *H01L 24/05* (2013.01); *H01L 24/13* (2013.01); *H01L 24/16* (2013.01); *H01L 24/27* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H05K 3/3436* (2013.01); *H05K 3/3489* (2013.01); *H05K 3/368* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/0566* (2013.01); *H01L 2224/0568* (2013.01); *H01L 2224/05684* (2013.01); *H01L 2224/1369* (2013.01); *H01L 2224/27422* (2013.01); *H01L 2224/29078* (2013.01); *H01L 2224/2919* (2013.01); *H01L 2224/32013* (2013.01); *H01L 2224/73103* (2013.01); *H01L 2224/73204* (2013.01); *H01L 2224/81024* (2013.01); *H01L 2224/81815* (2013.01); *H01L 2224/83862* (2013.01); *H01L 2224/9211* (2013.01); *H01L 2924/0665* (2013.01); *H05K 2203/0485* (2013.01)

(58) Field of Classification Search
USPC ........................................................ 361/760
See application file for complete search history.

(56) References Cited

FOREIGN PATENT DOCUMENTS

| | | |
|---|---|---|
| JP | 2018-186121 | 11/2018 |
| WO | 2009/147828 | 12/2009 |

OTHER PUBLICATIONS

International Preliminary Report on Patentability issued Jul. 20, 2023 in corresponding International (PCT) Patent Application No. PCT/JP2022/001988.

\* cited by examiner

[FIG. 1.]
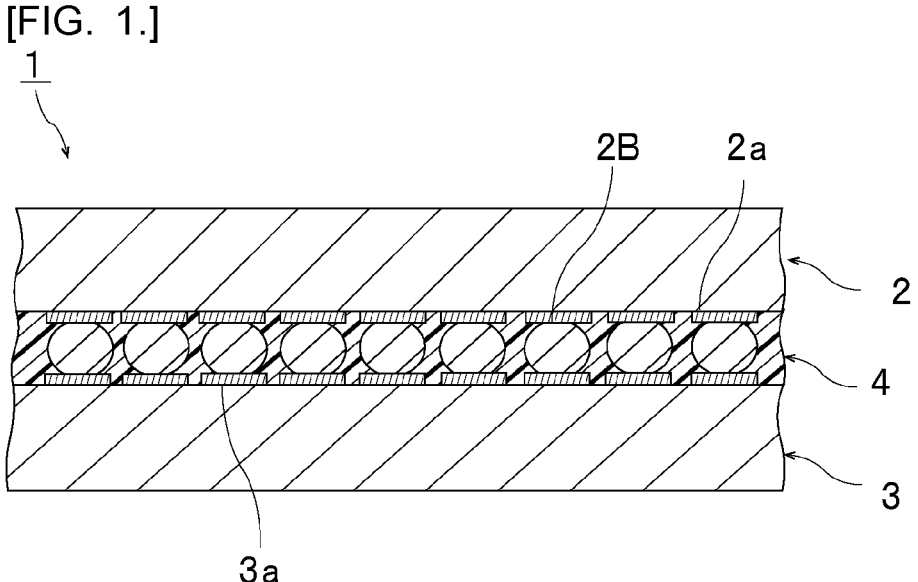

[FIG. 2.]
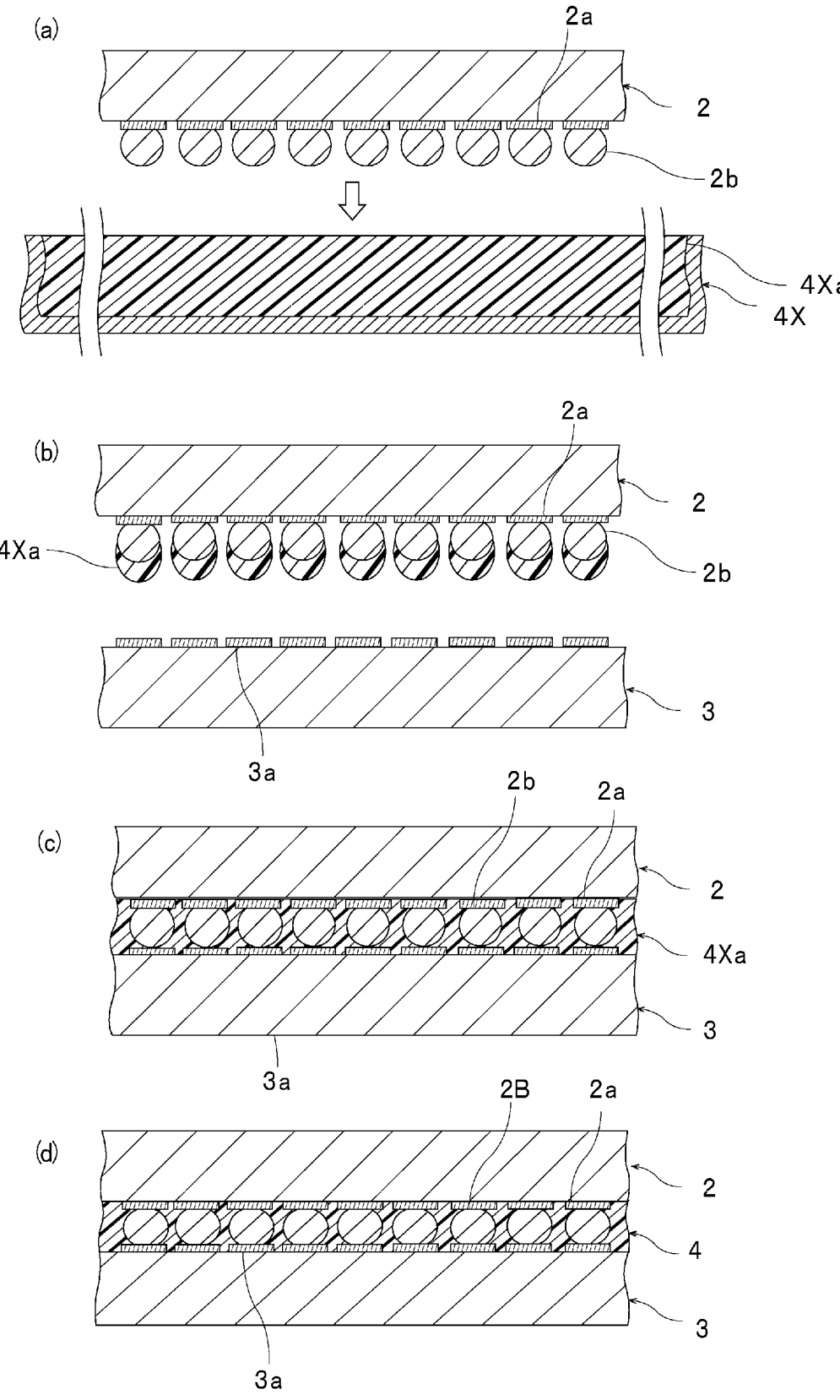

NON-ELECTROCONDUCTIVE FLUX, CONNECTED STRUCTURE, AND METHOD FOR PRODUCING CONNECTED STRUCTURE

TECHNICAL FIELD

The present invention relates to a non-electroconductive flux. The present invention also relates to a connected structure using the non-electroconductive flux and a method for producing a connected structure.

BACKGROUND ART

In recent years, with downsizing, weight reduction, and high functionality of electronic devices such as a data server, a personal computer (PC), and a portable terminal, a fine pitch of wiring in a printed wiring board and the like has been advanced. For this reason, surface mount packages such as a ball grid array (BGA) in which wiring extends directly below a chip and a very small chip scale package (CSP) have attracted attention.

However, unlike a conventional pin insertion type package, the surface mount package such as the BGA has a problem that since electrodes on a surface of a wiring substrate are connected to each other by solder balls, adhesiveness is lowered, and damage tends to occur (impact resistance is low) at the time of dropping.

Thus, a bonding portion may be reinforced by filling an underfill material between the surface mount package and the wiring substrate and then curing the underfill material.

Patent Document 1 below discloses a semiconductor package substrate in which a semiconductor chip is flip-chip mounted on one surface. The semiconductor package substrate is mounted on the printed wiring board from the other surface side of the semiconductor package substrate. The semiconductor package substrate includes a core substrate, a buildup layer, and a stress buffer layer. The buildup layer is a multilayer wiring layer in which a wiring pattern and an insulating resin layer are alternately stacked, and an uppermost layer of the buildup layer is the wiring pattern. The stress buffer layer is provided on a surface of the buildup layer on the other surface side. The stress buffer layer includes a first stress buffer layer and a second stress buffer layer on the first stress buffer layer, and each of the first stress buffer layer and the second stress buffer layer includes a via and the wiring pattern. After the semiconductor chip is mounted on one surface of the semiconductor package substrate, an underfill material is sealed between the semiconductor chip and the semiconductor package substrate.

RELATED ART DOCUMENT

Patent Document

Patent Document 1: JP 2018-186121 A

SUMMARY OF THE INVENTION

Problems to be Solved by the Invention

When the underfill material as described in Patent Document 1 is used as a sealing agent, adhesiveness between the semiconductor chip and the semiconductor package substrate can be enhanced, and impact resistance of the resulting connected structure (semiconductor package) can be enhanced.

However, in a production process of the connected structure, after a reflow step is performed to connect electrodes to each other, it is necessary to perform again the reflow step for curing the underfill material, after causing the underfill material to permeate and fill between the semiconductor chip and the semiconductor package substrate by a capillary phenomenon. That is, in a conventional method for producing a connected structure using an underfill material, it is necessary to perform the reflow step twice, and therefore, there is a problem that productivity is low. In addition, in a conventional connected structure using an underfill material, a solder connecting the electrodes to each other is melted in the second reflow step, so that a phenomenon (solder flash) in which the solder progresses while breaking an interface between the underfill material and a component (or substrate) may occur. When the solder flash occurs, short circuit or open failure may occur.

An object of the present invention is to provide a non-electroconductive flux capable of enhancing productivity and impact resistance of a connected structure to be obtained and suppressing occurrence of solder flash. It is also an object of the present invention to provide a connected structure using the non-electroconductive flux and a method for producing a connected structure.

Means for Solving the Problems

According to a broad aspect of the present invention, there is provided a non-electroconductive flux containing an epoxy compound, an acid anhydride curing agent, and an organophosphorus compound.

In a specific aspect of the non-electroconductive flux according to the present invention, an adhesive force at 25° C. is 100,000 N/m² or more and 210,000 N/m² or less.

In a specific aspect of the non-electroconductive flux according to the present invention, a viscosity at 25° C. is 400 Pa·s or less.

In a specific aspect of the non-electroconductive flux according to the present invention, the viscosity at 25° C. is 50 Pa·s or less.

In a specific aspect of the non-electroconductive flux according to the present invention, the content of the organophosphorus compound is 0.5 parts by weight or more and 10 parts by weight or less with respect to 100 parts by weight of the acid anhydride curing agent.

In a specific aspect of the non-electroconductive flux according to the present invention, the content of the acid anhydride curing agent in 100% by weight of the non-electroconductive flux is 5% by weight or more and 50% by weight or less.

In a specific aspect of the non-electroconductive flux according to the present invention, the non-electroconductive flux is a paste.

According to a broad aspect of the present invention, there is provided a connected structure including a first connection object member having a first electrode on its surface, a second connection object member having a second electrode on its surface, and a resin portion connecting the first connection object member and the second connection object member. In this connected structure, the first electrode includes a first electrode body and a solder particle on a surface of the first electrode body, the first electrode body and the second electrode are electrically connected, and a material of the resin portion is the non-electroconductive flux described above.

According to a broad aspect of the present invention, there is provided a method for producing a connected structure, including: a first disposing step of, by using a first connection object member which has a first electrode on its surface and in which the first electrode includes a first electrode body and a solder particle on a surface of the first electrode body, and using the non-electroconductive flux described above, disposing the non-electroconductive flux on a surface of the solder particles in the first connection object member; a second disposing step of disposing the first connection object member having the non-electroconductive flux disposed thereon and a second connection object member having a second electrode on its surface such that the first electrode and the second electrode face each other; and heating the solder particles and the non-electroconductive flux to electrically connect the first electrode and the second electrode and forming, with the non-electroconductive flux, a resin portion that connects the first connection object member and the second connection object member.

In a specific aspect of the method for producing a connected structure according to the present invention, in the first disposing step, the non-electroconductive flux is disposed by dipping.

Effect of the Invention

The non-electroconductive flux according to the present invention contains an epoxy compound, an acid anhydride curing agent, and an organophosphorus compound. In the non-electroconductive flux according to the present invention, since the above configuration is provided, it is possible to enhance productivity and impact resistance of a connected structure to be obtained and suppress occurrence of solder flash.

BRIEF DESCRIPTION OF DRAWINGS

FIG. 1 is a cross-sectional view schematically showing a connected structure obtained using a non-electroconductive flux according to one embodiment of the present invention.

FIGS. 2(*a*) to 2(*d*) are cross-sectional views for explaining respective steps of an example of a method for producing the connected structure using the non-electroconductive flux according to one embodiment of the present invention.

MODES FOR CARRYING OUT THE INVENTION

Hereinafter, the details of the present invention will be described.

(Non-Electroconductive Flux)

The non-electroconductive flux according to the present invention contains an epoxy compound, an acid anhydride curing agent, and an organophosphorus compound. The non-electroconductive flux does not have electroconductivity. The non-electroconductive flux preferably does not contain an electroconductive substance. The non-electroconductive flux preferably does not contain electroconductive particles. The non-electroconductive flux preferably does not contain solder. The non-electroconductive flux preferably does not contain solder particles. The non-electroconductive flux can be thermally cured. The non-electroconductive flux has a property of being cured by heating.

When sealing is performed using a conventional underfill material, a reflow step is performed twice for solder bonding and curing of the underfill material, and there is a problem that productivity is low.

Since the non-electroconductive flux according to the present invention is provided with the above configuration, when a connected structure is produced using the non-electroconductive flux, the solder can be melted to connect electrodes to each other by one reflow step, and the non-electroconductive flux can be cured. Thus, it is not necessary to perform the reflow step twice. That is, since the non-electroconductive flux of the present invention enables collective mounting when the connected structure is produced, the productivity can be enhanced.

The non-electroconductive flux according to the present invention may be disposed on a surface of the solder particles and used before the reflow step performed to melt the solder and connect the electrodes to each other. That is, the non-electroconductive flux according to the present invention may be used as a pre-applied underfill material. The non-electroconductive flux according to the present invention is preferably used as the pre-applied underfill material. In this case, the number of times of the reflow step can be reduced as compared with a case where the underfill material is filled after the reflow step for connecting the electrodes to each other and the reflow step is performed again. That is, when the non-electroconductive flux according to the present invention is used as the pre-applied underfill material, collective mounting can be performed when the connected structure is produced, so that the productivity can be further enhanced.

Since the non-electroconductive flux according to the present invention is provided with the above configuration, for example, a sufficient amount can be arranged when the non-electroconductive flux is disposed on a package by dipping. As a result, when an impact such as dropping is applied to the connected structure using the non-electroconductive flux according to the present invention, it is possible to reduce the probability that a connection failure or the like occurs and the connected structure fails. That is, impact resistance of the connected structure to be obtained can be enhanced. When the non-electroconductive flux is disposed on a connection object member, the connection object member can be easily pulled up from a dipping tank.

In addition, since the non-electroconductive flux according to the present invention is provided with the above configuration, it is possible to suppress occurrence of solder flash of the connected structure to be obtained and to enhance solder flash resistance. As a result, in the connected structure using the non-electroconductive flux according to the present invention, the occurrence of short circuit and open failure can be suppressed.

In addition, since the non-electroconductive flux according to the present invention is provided with the above configuration, connection resistance between upper and lower electrodes in the connected structure to be obtained can be reduced, and as a result, conduction reliability can be enhanced. In particular, in the present invention, since the acid anhydride curing agent and the organophosphorus compound are used in combination, a flux effect can be considerably enhanced.

In the present invention, non-electroconductivity means that insulation resistance is $1.0 \times 10^6 \Omega$ or more. The insulation resistance of the non-electroconductive flux can be measured, for example, by the following method. The non-electroconductive flux is applied with a thickness of 100 μm onto a surface of a comb-shaped substrate having a copper electrode on the surface to obtain a test specimen. The temperature of the obtained test specimen is increased to 160° C. at 2° C./sec in a nitrogen atmosphere (oxygen concentration: 100 ppm or less) using a reflow simulator (for example, "Core 9046a" manufactured by CORES CORPORATION), and then the test specimen is cooled to room temperature (23° C.). Thereafter, a voltage of 5 V is applied, and the insulation resistance is measured using a measuring device (for example, "Electrochemical migration evaluation system" manufactured by ESPEC CORP.).

In the present invention, the flux refers to a composition having a solder wetting diameter of 600 μm or more in the following solder wettability test. A composition is applied with a thickness of 150 μm onto a surface of a gold-plated printed board, and SnBi solder particles (particle size: 500 μm, melting point: 139° C.) are arranged on a surface of the composition to obtain a test specimen. The temperature of the obtained test specimen is increased to 160° C. at 2° C./sec in a nitrogen atmosphere (oxygen concentration: 100 ppm or less) using a reflow simulator (for example, "Core 9046a" manufactured by CORES CORPORATION), and the test specimen is held for 3 minutes and then cooled to room temperature (23° C.). Thereafter, the shape of the wet-spread solder is approximated by an ellipse, and an average of the minor axis and major axis ((minor axis+major axis)/2) of the ellipse is taken as the solder wetting diameter of the composition. The ellipse is a concept including a perfect circle, and when the ellipse is a perfect circle, the solder wetting diameter of the composition is a diameter of the perfect circle.

The non-electroconductive flux according to the present invention can be suitably used for connection between a surface mount package and a wiring substrate. Examples of the surface mount package include a BGA and a CSP.

An adhesive force (tack force) of the non-electroconductive flux at 25° C. is preferably 50,000 N/m$^2$ or more, more preferably 100,000 N/m$^2$ or more, still more preferably 120,000 N/m$^2$ or more, and particularly preferably 140,000 N/m$^2$ or more. The adhesive force (tack force) of the non-electroconductive flux at 25° C. is preferably 250,000 N/m$^2$ or less, more preferably 210,000 N/m$^2$ or less, still more preferably 170,000 N/m$^2$ or less, and particularly preferably 160,000 N/m$^2$ or less. When the adhesive force of the non-electroconductive flux at 25° C. is the above lower limit or more, a sufficient amount can be disposed when the non-electroconductive flux is disposed on the package by dipping. As a result, the impact resistance of the connected structure to be obtained can be more effectively enhanced. When the adhesive force of the non-electroconductive flux at 25° C. is the above upper limit or less, the package can be easily pulled up from the dipping tank.

The adhesive force (tack force) of the non-electroconductive flux at 25° C. is measured as follows. The non-electroconductive flux is applied with a thickness of 50 μm onto a surface of a stainless steel plate to obtain a laminate. Using a tack tester, a load when a probe (diameter: 8 mm, 10 g) is pushed into the laminate for 10 seconds and then pulled up at a speed of 0.1 mm/sec is measured. Examples of the tack tester include "TA-500" manufactured by Universal Building Materials Co., Ltd.

From the viewpoint of more effectively enhancing the impact resistance of the connected structure to be obtained, the viscosity (η 25) of the non-electroconductive flux at 25° C. is preferably 5 Pa·s or more, more preferably 25 Pa·s or more, and preferably 400 Pa·s or less, more preferably 300 Pa·s or less, still more preferably 50 Pa·s or less, particularly preferably 40 Pa·s or less. The viscosity (η25) can be appropriately adjusted depending on the type of compounded components and the blending amount.

The viscosity (η25) can be measured under conditions of 25° C. and 10 rpm, for example, using an E-type viscometer ("TVE22L" manufactured by Toki Sangyo Co., Ltd.) or the like.

From the viewpoint of enhancing the impact resistance of the connected structure to be obtained, the non-electroconductive flux is preferably liquid at 25° C., and is preferably a paste.

From the viewpoint of more effectively enhancing the impact resistance of the connected structure to be obtained, a melting point of the non-electroconductive flux is preferably 40° C. or higher, more preferably 70° C. or higher, and preferably 350° C. or lower, more preferably 310° C. or lower.

The melting point of the non-electroconductive flux can be determined by differential scanning calorimetry (DSC). Examples of a differential scanning calorimetry (DSC) device include "EXSTAR DSC7020" manufactured by Seiko Instruments Inc.

From the viewpoint of enhancing the conduction reliability, a reaction initiation temperature of the non-electroconductive flux is preferably 50° C. or higher, more preferably 70° C. or higher, still more preferably 80° C. or higher, and preferably 250° C. or lower, more preferably 200° C. or lower, still more preferably 150° C. or lower, particularly preferably 140° C. or lower.

<Epoxy Compound>

The epoxy compound is a compound having at least one epoxy group. Examples of the epoxy compound include a bixylenol type epoxy compound, a bisphenol A type epoxy compound, a bisphenol F type epoxy compound, a bisphenol S type epoxy compound, a phenol novolac type epoxy compound, a biphenyl type epoxy compound, a biphenyl novolac type epoxy compound, a biphenol type epoxy compound, a naphthalene type epoxy compound, a fluorene type epoxy compound, a phenol aralkyl type epoxy compound, a naphthol aralkyl type epoxy compound, a dicyclopentadiene type epoxy compound, an anthracene type epoxy compound, an epoxy compound having an adamantane skeleton, an epoxy compound having a tricyclodecane skeleton, a naphthylene ether type epoxy compound, and an epoxy compound having a triazine nucleus in its skeleton. One kind of the epoxy compound may be used alone, and two or more kinds thereof may be used in combination.

From the viewpoint of enhancing a dipping property, the epoxy compound is preferably a bixylenol type epoxy compound, a bisphenol F type epoxy compound, or an epoxy compound having a triazine nucleus in its skeleton, and more preferably a bixylenol type epoxy compound or a bisphenol F type epoxy compound. The epoxy compound is more preferably a bixylenol type epoxy compound.

From the viewpoint of further enhancing the impact resistance of the connected structure to be obtained, the epoxy compound is preferably liquid at 25° C.

From the viewpoint of further enhancing the impact resistance of the connected structure to be obtained, the content of the epoxy compound in 100% by weight of the non-electroconductive flux is preferably 15% by weight or more, more preferably 30% by weight or more, still more preferably 50% by weight or more, and preferably 70% by weight or less, more preferably 60% by weight or less, still more preferably 55% by weight or less.

<Acid Anhydride Curing Agent>

The acid anhydride curing agent thermally cures the epoxy compound. By using the acid anhydride curing agent in combination with an organophosphorus compound described later, the flux effect of the non-electroconductive flux can be considerably enhanced. As a result, an oxide film on the surface of the electrode and the solder in the connected structure to be obtained can be favorably removed.

Examples of the acid anhydride curing agent include bifunctional acid anhydride curing agents such as phthalic anhydride, tetrahydrophthalic anhydride, trialkyltetrahydrophthalic anhydride, hexahydrophthalic anhydride, methylhexahydrophthalic anhydride, methyltetrahydrophthalic anhydride, methylbutenyltetrahydrophthalic anhydride, anhydride of phthalic acid derivative, maleic anhydride, nadic anhydride, methylnadic anhydride, glutaric anhydride, succinic anhydride, glycerin bis trimellitic anhydride monoacetate, and ethylene glycol bis trimellitic anhydride, trifunctional acid anhydride curing agents such as trimellitic anhydride, and tetra- or higher functional acid anhydride curing agents such as pyromellitic anhydride, benzophenone tetracarboxylic anhydride, methylcyclohexene tetracarboxylic anhydride, and polyazelaic acid anhydride. One kind of the acid anhydride curing agent may be used alone, and two or more kinds thereof may be used in combination.

From the viewpoint of enhancing the dipping property, the acid anhydride curing agent is preferably tetrahydrophthalic anhydride or hexahydrophthalic anhydride, and more preferably hexahydrophthalic anhydride. From the viewpoint of further enhancing the dipping property, the hexahydrophthalic anhydride is preferably methylhexahydrophthalic anhydride.

The content of the acid anhydride curing agent in 100% by weight of the non-electroconductive flux is preferably 5% by weight or more, more preferably 10% by weight or more, still more preferably 25% by weight or more, and preferably 60% by weight or less, more preferably 50% by weight or less, still more preferably 45% by weight or less. When the content of the acid anhydride curing agent is the above lower limit or more and the above upper limit or less, the impact resistance and the solder flash resistance of the connected structure to be obtained can be further enhanced.

The content of the acid anhydride curing agent is preferably 50 parts by weight or more, more preferably 60 parts by weight or more, still more preferably 70 parts by weight or more, and preferably 120 parts by weight or less, more preferably 110 parts by weight or less, still more preferably 100 parts by weight or less with respect to 100 parts by weight of the epoxy compound. When the content of the acid anhydride curing agent is the above lower limit or more and the above upper limit or less, the impact resistance and the solder flash resistance of the connected structure to be obtained can be further enhanced.

<Organophosphorus Compound>

By using the organophosphorus compound and the acid anhydride curing agent in combination, fluxing properties of the non-electroconductive flux can be enhanced. As a result, an oxide film on the surface of the electrode and the solder in the connected structure to be obtained can be favorably removed. The impact resistance of the connected structure to be obtained can be enhanced.

Examples of the organophosphorus compound include an organophosphonium salt, an organophosphorus acid, an organophosphorus acid ester, an organophosphonic acid, an organophosphonic acid ester, an organophosphinic acid, or an organophosphinic acid ester. One kind of the organophosphorus compound may be used alone, and two or more kinds thereof may be used in combination.

From the viewpoint of enhancing the conduction reliability, the organophosphorus compound is preferably an organophosphonium salt, an organophosphorus acid, or an organophosphorus acid ester, and more preferably an organophosphonium salt.

Examples of the organophosphonium salt include an organophosphonium salt composed of a phosphonium ion and a counter ion thereof.

From the viewpoint of enhancing the conduction reliability, the organophosphonium salt is preferably methyltributylphosphonium dimethylphosphate, tributylmethylphosphonium bis(2-ethylhexyl)phosphate, or tetrabutylphosphonium bromide, and more preferably methyltributylphosphonium dimethylphosphate.

Examples of commercially available products of the organophosphonium salt include "HISHICOLIN" series manufactured by Nippon Chemical Industrial Co., Ltd.

The organophosphorus acid, the organophosphorus acid ester, the organophosphonic acid, the organophosphonic acid ester, the organophosphinic acid, and the organophosphinic acid ester are not particularly limited, and conventionally known compounds or commercially available products may be used.

From the viewpoint of further enhancing the impact resistance of the connected structure to be obtained, the organophosphorus compound is preferably liquid at 25° C.

From the viewpoint of further enhancing the impact resistance and the solder flash resistance of the connected structure to be obtained, the content of the organophosphorus compound in 100% by weight of the non-electroconductive flux is preferably 0.5% by weight or more, more preferably 0.8% by weight or more, and preferably 10% by weight or less, more preferably 8.0% by weight or less, still more preferably 4.0% by weight or less.

From the viewpoint of further enhancing the impact resistance and the solder flash resistance of the connected structure to be obtained, the content of the organophosphorus compound is preferably 0.5 parts by weight or more, more preferably 1 part by weight or more, still more preferably 2 parts by weight or more, and preferably parts by weight or less, more preferably 5 parts by weight or less with respect to 100 parts by weight of the acid anhydride curing agent.

<Other Components>

If necessary, the non-electroconductive flux may contain various additives such as a filler, an extender, a softener, a plasticizer, a thixotropic agent, a leveling agent, a polymerization catalyst, a curing catalyst, a colorant, an antioxidant, a thermal stabilizer, a light stabilizer, an ultraviolet absorber, a lubricant, an antistatic agent, and a flame retardant.

From the viewpoint of further enhancing the fluxing properties, the non-electroconductive flux may contain a compound having a carboxyl group or may contain a carboxylic acid compound. Since the non-electroconductive flux is excellent in fluxing properties, the non-electroconductive flux may not contain the compound having a carboxyl group or may not contain the carboxylic acid compound.

(Connected Structure and Method for Producing Connected Structure)

The non-electroconductive flux according to the present invention is suitably used for obtaining the connected structure. The non-electroconductive flux according to the present invention is suitably used for coating on the surface of the solder (use of the non-electroconductive flux on the surface of the solder). The non-electroconductive flux according to the present invention is suitably used for coating on the surface of the solder particles (use of the non-electroconductive flux on the surface of the solder particles). The non-electroconductive flux according to the present invention may be a coating material for solder. The non-electroconductive flux according to the present invention may be a coating material for solder particles. The non-electroconductive flux according to the present invention is also suitably used for coating on the surface of the electrode (use of the non-electroconductive flux on the surface of the electrode). The non-electroconductive flux according to the present invention is also suitably used for coating on the surface of the electroconductive particles (use of the non-electroconductive flux on the surface of the electroconductive particles). The non-electroconductive flux according to the present invention may be a coating material for an electrode. The non-electroconductive flux according to the present invention may be a coating material for electroconductive particles.

The connected structure according to the present invention includes a first connection object member having a first electrode on its surface, a second connection object member having a second electrode on its surface, and a resin portion connecting the first connection object member and the second connection object member. In the connected structure according to the present invention, the first electrode includes a first electrode body and a solder particle on a surface of the first electrode body. In the connected structure according to the present invention, the first electrode body and the second electrode are electrically connected to each other. In the connected structure according to the present invention, the material of the resin portion is the above-described non-electroconductive flux.

In the method for producing a connected structure according to the present invention, the first connection object member having the first electrode on its surface is used, and the first electrode includes the first electrode body and a solder particle on a surface of the first electrode body. The method for producing a connected structure according to the present invention includes a first disposing step of disposing the non-electroconductive flux on the surface of the solder particle in the first connection object member using the first connection object member and using the non-electroconductive flux. The method for producing a connected structure according to the present invention includes a second disposing step of disposing the first connection object member having the non-electroconductive flux disposed thereon and a second connection object member having a second electrode on its surface such that the first electrode and the second electrode face each other. The method for producing a connected structure according to the present invention includes a step of heating the solder particles and the non-electroconductive flux to form, with the non-electroconductive flux, a resin portion that electrically connects the first electrode and the second electrode and connects the first connection object member and the second connection object member.

In the method for producing a connected structure according to the present invention, in the first disposing step, the non-electroconductive flux may be disposed by dispensing, by screen printing, by ejection by an inkjet device, or by dipping. From the viewpoint of further enhancing the productivity, it is preferable to dispose the non-electroconductive flux by dipping in the first disposing step.

In a conventional method for producing a connected structure using an underfill material, after a reflow step is performed to connect electrodes to each other, it is necessary to perform again the reflow step for curing the underfill material, after causing the underfill material to permeate and fill between the connection object members by a capillary phenomenon. That is, in a conventional method for producing a connected structure using an underfill material, it is necessary to perform the reflow step twice, and therefore, there is a problem that productivity is low. In addition, in a conventional connected structure using an underfill material, solder flash may occur. When the solder flash occurs, short circuit or open failure may occur.

In the connected structure and the method for producing a connected structure according to the present invention, since a specific non-electroconductive flux is used, the electrodes can be electrically connected to each other and the non-electroconductive flux can be cured by one reflow step. Thus, it is not necessary to perform the reflow step twice. That is, in the connected structure and the method for producing a connected structure according to the present invention, collective mounting is possible, and as a result, the productivity can be further enhanced. Further, in the connected structure and the method for producing a connected structure according to the present invention, since a specific non-electroconductive flux is used, for example, a sufficient amount can be disposed when the non-electroconductive flux is disposed on a package by dipping. As a result, when an impact such as dropping is applied to the connected structure, it is possible to reduce the probability that a connection failure or the like occurs and the connected structure fails (impact resistance can be enhanced). Furthermore, in the connected structure and the method for producing a connected structure according to the present invention, since a specific non-electroconductive flux is used, it is possible to suppress the occurrence of solder flash. As a result, in the connected structure to be obtained, the occurrence of short circuit and open failure can be suppressed.

Hereinafter, specific embodiments of the present invention will be described with reference to the drawings.

FIG. 1 is a cross-sectional view schematically showing the connected structure obtained using the non-electroconductive flux according to one embodiment of the present invention.

A connected structure 1 shown in FIG. 1 includes a first connection object member 2, a second connection object member 3, and a resin portion 4 connecting the first connection object member 2 and the second connection object member 3. The resin portion 4 is formed of a non-electroconductive flux 4Xa (see FIGS. 2(a) to 2(d)). The material of the resin portion 4 is the non-electroconductive flux 4Xa. In the present embodiment, the non-electroconductive flux 4Xa contains an epoxy compound, an acid anhydride curing agent, and an organophosphorus compound. In the present embodiment, the non-electroconductive flux 4Xa is a paste.

The resin portion 4 is a cured product portion obtained by thermally curing the non-electroconductive flux 4Xa.

The first connection object member 2 has a plurality of first electrodes on its surface (lower surface). The first electrode includes a first electrode body 2a and a solder portion 2B (solder particle) on a surface of the first electrode body 2a. The first electrode is a composite electrode of the first electrode body 2a and the solder portion 2B. The second connection object member 3 has a plurality of second electrodes 3a on its surface (upper surface). In the connected structure 1, the first electrode body 2a and the second electrode 3a are electrically connected to each other. In the connected structure 1, the first electrode body 2a and the second electrode 3a are electrically connected to each other by the solder portion 2B.

As shown in FIG. 1, in the connected structure 1, after at least a portion of the solder particles in contact with the second electrode 3a melt between the first electrode body 2a and the second electrode 3a, the solder particles are solidified to form the solder portion 2B. Thus, a connection area between the solder portion 2B and the second electrode 3a increases. In the connected structure, the solder particles may remain. In the connected structure, solder particles and a solder portion may be present.

Next, an example of the method for producing a connected structure will be specifically described with reference to FIGS. 2(a) to 2(d). FIGS. 2(a) to 2(d) are cross-sectional views for explaining respective steps of an example of a method for producing the connected structure using the non-electroconductive flux according to one embodiment of the present invention.

First, as shown in FIGS. 2(a) and 2(b), the first connection object member 2 having the first electrode on a surface (lower surface) is prepared. The first electrode includes the first electrode body 2a and a solder particle 2b on the surface of the first electrode body 2a. The non-electroconductive flux 4Xa is prepared. The non-electroconductive flux 4Xa is filled in a dipping tank 4X. The non-electroconductive flux 4Xa is disposed on a surface of the solder particles 2b in the first connection object member 2 (first disposing step). The non-electroconductive flux 4Xa contains an epoxy compound, an acid anhydride curing agent, and an organophosphorus compound.

In the first disposing step, the non-electroconductive flux 4Xa is disposed on the surface of the solder particles 2b in the first connection object member 2 by dipping. The first connection object member 2 is immersed in the dipping tank 4X filled with the non-electroconductive flux 4Xa, and the non-electroconductive flux 4Xa is disposed on the surface of the solder particles 2b in the first connection object member 2. The non-electroconductive flux 4Xa coats the surface of the solder particles 2b and is a coating layer. The coating layer that is the non-electroconductive flux 4Xa is disposed along the surface of the solder particles 2b.

The amount of the non-electroconductive flux disposed on the surface of the solder particles is preferably an amount capable of filling a void between the first connection object member and the second connection object member in the connected structure to be obtained.

On the other hand, the second connection object member 3 having the second electrode 3a on its surface (upper surface) is prepared. Next, as shown in FIGS. 2(b) and 2(c), the first connection object member 2 on which the non-electroconductive flux 4Xa is disposed and the second connection object member 3 are arranged such that the first electrode (first electrode body 2a and solder particles 2b) and the second electrode 3a face each other (second disposing step). The second connection object member 3 is disposed from the second electrode 3a side toward the first electrode side of the first connection object member 2. At this time, the first electrode body 2a and the second electrode 3a face each other.

Next, as shown in FIG. 2(d), the solder particles 2b and the non-electroconductive flux 4Xa are heated (third step). Preferably, the non-electroconductive flux is heated to a temperature equal to or higher than a temperature at which a portion of the solder particles in contact with the second electrode is melted. More preferably, the non-electroconductive flux 4Xa is heated to a temperature equal to or higher than the curing temperature of the epoxy compound. By this heating, the first electrode (first electrode body 2a, and solder particle 2b or solder portion 2B) and the second electrode 2a are electrically connected. The non-electroconductive flux 4Xa is thermally cured. As a result, as shown in FIG. 2(d), the resin portion 4 connecting the first connection object member 2 and the second connection object member 3 is formed by the non-electroconductive flux 4Xa. The resin portion 4 is formed by thermally curing the non-electroconductive flux 4Xa. As shown in FIG. 2(d), the solder portion 2B is formed by the solder particles 2b, and the first electrode body 2a and the second electrode 3a are electrically connected by the solder portion 2B.

Thus, the connected structure 1 shown in FIG. 1 is obtained. The second process and the third process may be performed continuously. After the second step is performed, a laminate of the first connection object member 2, the non-electroconductive flux 4Xa, and the second connection object member 3 is moved to a heating section, and the third step may be performed. In order to perform the heating, the laminate may be placed on a heating member, and the laminate may be placed in a heated space.

The heating temperature in the third step is preferably 140° C. or higher, more preferably 160° C. or higher, and preferably 450° C. or lower, more preferably 250° C. or lower, still more preferably 200° C. or lower. The heating temperature in the third step is preferably higher than or equal to the melting point of the solder particles. The heating temperature in the third step is preferably higher than or equal to the curing temperature of the epoxy compound. The heating temperature in the third step is preferably equal to or higher than the temperature at which the portion of the solder particles in contact with the second electrode is melted, and more preferably equal to or higher than the curing temperature of the epoxy compound.

Examples of the heating method in the third step include a method of heating the entire laminate using a reflow furnace or an oven, and a method of locally heating only the solder portion (solder particles) and the resin portion (non-electroconductive flux) of the laminate.

Examples of instruments used for the local heating method include a hot plate, a heat gun for applying hot air, a soldering iron, and an infrared heater.

When local heating is performed using a hot plate, it is preferable that directly under the solder portion (solder particles) and the resin portion (non-electroconductive flux), an upper surface of the hot plate is formed with a metal with a high thermal conductivity, and in other portions not preferable to be heated, the upper surface of the hot plate is formed with a material with a low thermal conductivity such as a fluororesin.

The thickness of the solder portion in the connected structure is preferably 10 μm or more, more preferably 20 μm or more, and preferably 100 μm or less, more preferably 80 μm or less.

The thickness of the resin portion in the connected structure is preferably 10 μm or more, more preferably 20 μm or more, and preferably 100 μm or less, more preferably 80 μm or less.

The viscosity (ηmp) of the non-electroconductive flux at the melting point of the solder particles is preferably 0.1 Pa·s or more, more preferably 0.2 Pa·s or more, and preferably 50 Pa·s or less, more preferably 10 Pa·s or less, still more preferably 1 Pa·s or less. When the viscosity (ηmp) is the above lower limit or more and the above upper limit or less, the conduction reliability can be further improved.

The viscosity (ηmp) can be measured, for example, using a rheometer "HAAKE MARS III" manufactured by Thermo Fisher Scientific under the conditions of a frequency of 2 Hz, a heating rate of 0.11° C./sec, and a measurement temperature range of 25° C. to 200° C. (however, when the melting point of the solder particles is more than 200° C., the upper limit of the temperature is defined as the melting point of the solder particles). From the measurement results, the viscosity at the melting point (° C.) of the solder particles is evaluated.

When the non-electroconductive flux is a paste (liquid), the thickness of the resin portion can be easily adjusted by the application amount of the non-electroconductive flux.

The first and second connection object members are not particularly limited. Specific examples of the first and second connection object members include electronic components such as a semiconductor chip, a semiconductor package, an LED chip, an LED package, a capacitor and a diode, and electronic components such as a resin film, a printed board, a flexible printed board, a flexible flat cable, a rigid flexible substrate, a glass epoxy substrate, and a circuit board such as a glass substrate. The first and second connection object members are preferably electronic components.

Examples of the electrode provided on the connection object member include metal electrodes such as a gold electrode, a nickel electrode, a tin electrode, an aluminum electrode, a copper electrode, a molybdenum electrode, a silver electrode, a SUS electrode, and a tungsten electrode. When the connection object member is a flexible printed board, the electrode is preferably a gold electrode, a nickel electrode, a tin electrode, a silver electrode or a copper electrode. When the connection object member is a glass substrate, the electrode is preferably an aluminum electrode, a copper electrode, a molybdenum electrode, a silver electrode or a tungsten electrode. When the electrode is an aluminum electrode, it may be an electrode formed only of aluminum, or may be an electrode with an aluminum layer stacked on the surface of a metal oxide layer. Examples of the material of the metal oxide layer include indium oxide doped with a trivalent metal element and zinc oxide doped with a trivalent metal element. Examples of the trivalent metal element include Sn, Al, and Ga.

The present invention will be specifically described below by way of Examples and Comparative Examples. The present invention is not limited only to the following Examples.

Epoxy Compound:

Epoxy compound 1 (bisphenol F type epoxy compound, "YDF-8170C" manufactured by Nippon Steel & Sumikin Chemical Co., Ltd.)

Epoxy compound 2 (bixylenol epoxy compound, "YX-4000HK" manufactured by Mitsubishi Chemical Corporation)

Curing Agent:

Acid anhydride curing agent 1 (mixture of hexahydrophthalic anhydride and methylhexahydrophthalic anhydride, "RIKACID MH-700" manufactured by New Japan Chemical Co., Ltd.)

Acid anhydride curing agent 2 (tetrahydrophthalic anhydride, "RIKACID TH" manufactured by New Japan Chemical Co., Ltd.)

Imidazole curing agent ("2E4MZ-A" manufactured by Shikoku Chemicals Corporation)

Organophosphorus Compound:

Organophosphorus compound 1 (tetrabutylphosphonium bromide, "HISHICOLIN PX-4B" manufactured by Nippon Chemical Industrial Co., Ltd., melting point: 110° C.)

Organophosphorus compound 2 (methyltributylphosphonium dimethylphosphate, "HISHICOLIN PX-4MP" manufactured by Nippon Chemical Industrial Co., Ltd., melting point: 10° C.)

Examples 1 to 8 and Comparative Examples 1 and 2

(1) Preparation of Non-Electroconductive Flux or Composition

Components shown in Tables 1 to 3 below were compounded in blending amounts shown in Tables 1 to 3 below to obtain a non-electroconductive flux or a composition.

(2) Production of Connected Structure

The non-electroconductive flux (composition) immediately after production was filled in a dipping tank. A BGA (0.8 mm pitch, 100 electrodes) was prepared as the first connection object member (package) having the first electrode on its surface. As the second connection object member, a printed circuit board (material: FR4, thickness: 1 mm) having the second electrode (gold electrode) corresponding to the first connection object member on its surface was provided. The first connection object member was immersed in the dipping tank for 1 second, and the non-electroconductive flux (composition) was disposed on the solder particles on the surface of the first electrode body (first disposing step). Next, the second connection object member was stacked on the lower surface of the non-electroconductive flux (composition) such that the electrodes faced each other (second disposing step). The weight of the second connection object member was added to the solder particles and the non-electroconductive flux (composition). From that state, heating was performed to increase the temperatures of the solder particles and the non-electroconductive flux to the melting point of the solder particle after 50 seconds from the beginning of temperature rising. In addition, 65 seconds after the start of the temperature rising, heating was performed such that each temperature of the solder particles (solder portion) and the non-electroconductive flux (resin portion) was 160° C. Thereafter, the non-electroconductive flux (composition) was cured by holding at 160° C. for 120 seconds to obtain a connected structure. During heating, pressurization was not performed.

(Evaluation)

(1) Viscosity

The viscosity (η 25) of 0.1 mL of the obtained non-electroconductive flux (composition) at 25° C. was measured under conditions of 25° C. and 10 rpm using an E-type viscometer ("TVE22L" manufactured by Toki Sangyo Co., Ltd.). As a cone rotor, a cone rotor of 3°×R7.7 was used.

(2) Adhesive Force

The obtained non-electroconductive flux (composition) was applied with a thickness of 50 μm onto a surface of a stainless steel plate to obtain a laminate. Using a tack tester ("TA-500" manufactured by Universal Building Materials Co., Ltd.), the load when a probe (diameter: 8 mm, g) was pushed into the laminate for 10 seconds and then pulled up at a speed of 0.1 mm/sec was measured and taken as an adhesive force of 25° C.

(3) Impact Resistance (Drop Reliability)

The obtained connected structure was dropped 300 times at an acceleration of 1500 G. The number of connected structures in which open failure occurred in 20 connected structures after a drop test was defined as the number of failures. The impact resistance was assessed according to the following criteria.

[Assessment Criteria for Impact Resistance]

○○: The number of failures is zero

○: The number of failures is one

Δ: The number of failures is two x: The number of failures is three or more (4) Solder Flash Occurrence Inhibition Performance The obtained connected structure was heated so as to have the melting point of the solder particles 50 seconds after the start of the temperature rising. In addition, 75 seconds after the start of the temperature rising, heating was performed such that each temperature of the solder portion and the resin portion was 180° C., and held at 180° C. for 60 seconds. Thereafter, cooling was performed, and the number of connected structures in which open failure or short circuit occurred in 20 connected structures was defined as the number of occurrences of open failure or short circuit. Solder flash occurrence inhibition performance was assessed according to the following criteria.

[Assessment Criteria for Solder Flash Occurrence Inhibition Performance]

○: The number of occurrences of open failure or short circuit is zero x: The number of occurrences of open failure or short circuit is one or more (5) Conduction Reliability (Between Upper and Lower Electrodes)

In the obtained 20 connected structures, 100 connection resistances between the upper and lower electrodes were measured with a two-terminal resistance meter, and an average value of the connection resistances was calculated. From the relationship of voltage=current×resistance, the connection resistance can be obtained by measuring the voltage when a constant current flows. The conduction reliability was assessed according to the following criteria.

[Assessment Criteria for Conduction Reliability]

○: The average value of connection resistances is 0.9 mΩ or less x: The average value of connection resistances is more than 0.9 mΩ, or a connection failure occurs (6) Dipping Property In the production of the connected structure, the first connection object member was immersed in the dipping tank for 1 second, and then the first connection object member was pulled up. The amount of the non-electroconductive flux (composition) attached to the solder particles was visually confirmed. The dipping property was assessed according to the following criteria.

[Assessment Criteria for Dipping Property]

○: The first connection object member can be pulled up from the dipping tank, and the non-electroconductive flux (composition) in an amount sufficient to fill a void between the connection object members can be disposed on the surface of the solder particles.

x: The first connection object member cannot be pulled up from the dipping tank, or the non-electroconductive flux (composition) in an amount sufficient to fill a void between the connection object members cannot be disposed on the surface of the solder particles.

(7) Fluxing Properties

The obtained non-electroconductive flux (composition) was applied with a thickness of 150 μm onto a surface of a gold-plated printed board, and SnBi solder particles (particle size: 500 μm, melting point: 139° C.) were arranged on the surface of the composition to obtain a test specimen. The temperature of the obtained test specimen was increased to 160° C. at 2° C./sec in a nitrogen atmosphere (oxygen concentration: 100 ppm or less) using a reflow simulator ("Core 9046a" manufactured by CORES CORPORATION), and the test specimen was held for 3 minutes and then cooled to room temperature (23° C.). Thereafter, the shape of the wet-spread solder was approximated by an ellipse, and an average of the minor axis and major axis ((minor axis+major axis)/2) of the ellipse was taken as the solder wetting diameter of the non-electroconductive flux (composition). The fluxing properties were assessed according to the following criteria. When the ellipse was a perfect circle, the solder wetting diameter of the non-electroconductive flux (composition) was the diameter of the perfect circle.

[Assessment Criteria for Fluxing Properties]

○: The solder wetting diameter is 600 μm or more x: The solder wetting diameter is less than 600 μm (8) Non-Electroconductivity The non-electroconductive flux (composition) was applied with a thickness of 100 μm onto a surface of a comb-shaped substrate having a copper electrode on the surface to obtain a test specimen. The temperature of the obtained test specimen was increased to 160° C. at 2° C./sec in a nitrogen atmosphere (oxygen concentration: 100 ppm or less) using a reflow simulator ("Core 9046a" manufactured by CORES CORPORATION), and then the test specimen was cooled to room temperature (23° C.). Thereafter, a voltage of 5 V was applied, and the insulation resistance was measured using a measuring device ("Electrochemical migration evaluation system" manufactured by ESPEC CORP.). The non-electroconductivity was assessed according to the following criteria.

[Assessment Criteria for Non-Electroconductivity]

○: The insulation resistance is $1.0 \times 10^{6}\,\Omega$ or more x: The insulation resistance is less than $1.0 \times 10^{6}\,\Omega$ The results are shown in Tables 1 to 3 below.

TABLE 1

| | | | Example 1 | Example 2 | Example 3 | Example 4 |
|---|---|---|---|---|---|---|
| Non-electroconductive flux | Epoxy compound 1 | Part(s) by weight | | | 45 | |
| | Epoxy compound 2 | Part(s) by weight | 58 | | 51 | 58 |
| | Curing agent — Acid anhydride curing agent 1 | Part(s) by weight | 42 | | 49 | 42 |
| | Acid anhydride curing agent 2 | Part(s) by weight | | 55 | | |
| | Imidazole curing agent | Part(s) by weight | | | | |
| | Organophosphorus compound 1 | Part(s) by weight | 2 | 2 | 2 | |
| | Organophosphorus compound 2 | Part(s) by weight | | | | 4 |
| Evaluation | Viscosity | Pa · s | 35 | 45 | 25 | 42 |
| | Adhesive force | N/m² | 170000 | 250000 | 100000 | 210000 |
| | Impact resistance | | ○○ | Δ | ○○ | ○ |

TABLE 1-continued

|  | Example 1 | Example 2 | Example 3 | Example 4 |
|---|---|---|---|---|
| Solder flash occurrence inhibition performance | ○ | ○ | ○ | ○ |
| Conduction reliability | ○ | ○ | ○ | ○ |
| Dipping property | ○ | ○ | ○ | ○ |
| Fluxing properties | ○ | ○ | ○ | ○ |
| Non-electroconductivity | ○ | ○ | ○ | ○ |

TABLE 2

|  |  |  |  | Example 5 | Example 6 | Example 7 | Example 8 |
|---|---|---|---|---|---|---|---|
| Non-electroconductive flux | Epoxy compound 1 | | Part(s) by weight | | | | 54 |
|  | Epoxy compound 2 | | Part(s) by weight | 58 | 58 | 58 | |
|  | Curing agent | Acid anhydride curing agent 1 | Part(s) by weight | 42 | 42 | 42 | 46 |
|  |  | Acid anhydride curing agent 2 | Part(s) by weight | | | | |
|  |  | Imidazole curing agent | Part(s) by weight | | | | |
|  | Organophosphorus compound 1 | | Part(s) by weight | | | | 2 |
|  | Organophosphorus compound 2 | | Part(s) by weight | 2 | 1 | 0.5 | |
| Evaluation | Viscosity | | Pa · s | 33 | 28 | 27 | 5 |
|  | Adhesive force | | N/m² | 150000 | 130000 | 120000 | 50000 |
|  | Impact resistance | | | ○○ | ○○ | ○ | Δ |
|  | Solder flash occurrence inhibition performance | | | ○ | ○ | ○ | ○ |
|  | Conduction reliability | | | ○ | ○ | ○ | ○ |
|  | Dipping property | | | ○ | ○ | ○ | ○ |
|  | Fluxing properties | | | ○ | ○ | ○ | ○ |
|  | Non-electroconductivity | | | ○ | ○ | ○ | ○ |

TABLE 3

|  |  |  |  | Comparative Example 1 | Comparative Example 2 |
|---|---|---|---|---|---|
| Composition | Epoxy compound 1 | | Part(s) by weight | | 45 |
|  | Epoxy compound 2 | | Part(s) by weight | 47 | |
|  | Curing agent | Acid anhydride curing agent 1 | Part(s) by weight | 53 | |
|  |  | Acid anhydride curing agent 2 | Part(s) by weight | | 55 |
|  |  | Imidazole curing agent | Part(s) by weight | 5 | 5 |
|  | Organophosphorus compound 1 | | Part(s) by weight | | |
|  | Organophosphorus compound 2 | | Part(s) by weight | | |
| Evaluation | Viscosity | | Pa · s | 20 | 20 |
|  | Adhesive force | | N/m² | 190000 | 230000 |
|  | Impact resistance | | | X | X |
|  | Solder flash occurrence inhibition performance | | | ○ | X |
|  | Conduction reliability | | | ○ | X |
|  | Dipping property | | | ○ | X |
|  | Fluxing properties | | | X | X |
|  | Non-electroconductivity | | | ○ | ○ |

In any of the examples, the reflow step was performed only once.

EXPLANATION OF SYMBOLS

1: Connected structure
2: First connection object member
2*a*: First electrode body
2*b*: Solder particle
2B: Solder portion
3: Second connection object member
3*a*: Second electrode
4: Resin portion
4X: Dipping tank
4Xa: Non-electroconductive flux

The invention claimed is:

1. A non-electroconductive flux comprising:
an epoxy compound;
an acid anhydride curing agent; and
an organophosphorus compound,
the organophosphorus compound comprising at least one selected from the group consisting of an organophosphonium salt, an organophosphorus acid, an organophosphorus acid ester, an organophosphonic acid, an organophosphonic acid ester, an organophosphinic acid, and an organophosphinic acid ester, and
a content of the organophosphorus compound being 0.5 parts by weight or more and 10 parts by weight or less with respect to 100 parts by weight of the acid anhydride curing agent.

2. The non-electroconductive flux according to claim 1, wherein an adhesive force at 25° C. is 100,000 N/m² or more and 210,000 N/m² or less.

3. The non-electroconductive flux according to claim 1, wherein a viscosity at 25° C. is 400 Pa's or less.

4. The non-electroconductive flux according to claim 3, wherein the viscosity at 25° C. is 50 Pa's or less.

5. The non-electroconductive flux according to claim 1, wherein the content of the organophosphorus compound is 0.5 parts by weight or more and 3.64 parts by weight or less with respect to 100 parts by weight of the acid anhydride curing agent.

6. The non-electroconductive flux according to claim 1, wherein a content of the acid anhydride curing agent in 100% by weight of the non-electroconductive flux is 5% by weight or more and 50% by weight or less.

7. The non-electroconductive flux according to claim 1, which is a paste.

8. A connected structure comprising:
a first connection object member having a first electrode on its surface;
a second connection object member having a second electrode on its surface; and
a resin portion connecting the first connection object member and the second connection object member,
the first electrode including a first electrode body and a solder particle on a surface of the first electrode body,
the first electrode body and the second electrode being electrically connected, and
a material of the resin portion being the non-electroconductive flux according to claim 1.

9. A method for producing a connected structure, comprising:
a first disposing step of, by using a first connection object member which has a first electrode on its surface and in which the first electrode includes a first electrode body and a solder particle on a surface of the first electrode body, and using the non-electroconductive flux according to claim 1, disposing the non-electroconductive flux on a surface of the solder particles in the first connection object member;
a second disposing step of disposing the first connection object member having the non-electroconductive flux disposed thereon and a second connection object member having a second electrode on its surface such that the first electrode and the second electrode face each other; and
a step of heating the solder particles and the non-electroconductive flux to electrically connect the first electrode and the second electrode and forming, with the non-electroconductive flux, a resin portion that connects the first connection object member and the second connection object member.

10. The method for producing a connected structure according to claim 9, wherein in the first disposing step, the non-electroconductive flux is disposed by dipping.

11. The non-electroconductive flux according to claim 1, wherein the organophosphorus compound comprises the organophosphonium salt.

12. The non-electroconductive flux according to claim 1, wherein the organophosphorus compound is liquid at 25° C.

13. The non-electroconductive flux according to claim 1, containing no compound having a carboxyl group.

14. The non-electroconductive flux according to claim 1, consisting of the epoxy compound, the acid anhydride curing agent and the organophosphorus compound.

15. The non-electroconductive flux according to claim 1, wherein the content of the organophosphorus compound is 2 parts by weight or more and 5 parts by weight or less with respect to 100 parts by weight of the acid anhydride curing agent.

\* \* \* \* \*